United States Patent
Shibata et al.

(10) Patent No.: US 6,962,628 B1
(45) Date of Patent: Nov. 8, 2005

(54) METHOD OF TREATING EPOXY RESIN-CURED PRODUCT

(75) Inventors: Katsuji Shibata, Ibaraki (JP); Hiroshi Shimizu, Ibaraki (JP); Ayako Iwamaru, Tochigi (JP); Takeshi Horiuchi, Tochigi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 446 days.

(21) Appl. No.: 10/088,531

(22) PCT Filed: Oct. 5, 2000

(86) PCT No.: PCT/JP00/06951

§ 371 (c)(1),
(2), (4) Date: May 31, 2002

(87) PCT Pub. No.: WO01/25317

PCT Pub. Date: Apr. 12, 2001

(30) Foreign Application Priority Data

| Oct. 7, 1999 | (JP) | ................................. 11/286187 |
| Oct. 7, 1999 | (JP) | ................................. 11/286188 |

(51) Int. Cl.⁷ ............................. B08B 7/04; B08B 5/00
(52) U.S. Cl. ........................... 134/13; 134/10; 521/40; 521/40.5
(58) Field of Search ............................ 588/205, 207, 588/210; 510/175, 176; 134/38, 42, 10, 13; 521/40, 40.5; 252/364

(56) References Cited

U.S. PATENT DOCUMENTS

| 3,551,204 A | * | 12/1970 | Bolger et al. ................. 134/42 |
| 3,625,763 A | * | 12/1971 | Melillo ........................ 134/38 |
| 3,673,099 A | * | 6/1972 | Corby et al. ................. 510/206 |
| 3,770,528 A | * | 11/1973 | Hermes ........................ 216/83 |
| 4,089,704 A | * | 5/1978 | Heiss, Jr. et al. ............. 134/29 |
| 4,276,186 A | * | 6/1981 | Bakos et al. ................... 134/38 |
| 4,278,557 A | * | 7/1981 | Elwell, Jr. ................... 510/204 |
| 4,316,322 A | * | 2/1982 | Tranberg ...................... 29/852 |
| 4,428,871 A | * | 1/1984 | Ward et al. .................. 510/176 |
| 4,741,784 A | * | 5/1988 | Roeser, Jr. .................... 134/38 |
| 5,536,439 A | * | 7/1996 | Harbin ........................ 510/212 |
| 6,245,822 B1 | * | 6/2001 | Terada et al. ................. 521/49 |
| 6,780,894 B2 | * | 8/2004 | Shibata et al. ................ 521/48 |

FOREIGN PATENT DOCUMENTS

| JP | 8-325437 | 12/1996 |
| JP | 8-325438 | 12/1996 |
| JP | 8-325439 | 12/1996 |
| JP | 9-316445 | 12/1997 |
| JP | 10-126052 | 5/1998 |
| JP | 10314713 | 12/1998 |
| JP | 10314716 | 12/1998 |
| JP | 11-209754 | 8/1999 |

OTHER PUBLICATIONS

English Language Abstract of JP 10-314713, Dec. 2, 1998.
English Language Abstract of JP 10-314716, Dec. 2, 1998.
English Language Abstract of JP 8-325436, Dec. 10, 1996.
English Language Abstract of JP 8-325437, Dec. 10, 1996.
English Language Abstract of JP 8-325438, Dec. 10, 1996.
English Language Abstract of JP 9-316445, Dec. 9, 1997.
English Language Abstract of JP 10-126052, May 15, 1998.
English Language Abstract of JP 11-209754, Aug. 3, 1999.

* cited by examiner

*Primary Examiner*—Colleen P. Cooke
(74) *Attorney, Agent, or Firm*—Greenblum & Bernstein, P.L.C.

(57) ABSTRACT

A method of treating a composite material of epoxy resin-cured product and inorganic matter to easily recover the resin components in a recyclable state without causing thermal decomposition. A method of separating the inorganic matter. The epoxy resin-cured product is treated with a treatment liquid which contains a decomposition catalyst for epoxy resin-cured products and an organic solvent to decompose and dissolve the epoxy resin-cured product. A composite material of epoxy resin-cured product and inorganic matter is also treated to decompose and dissolve the epoxy resin-cured product in the above-mentioned manner and the inorganic matter is then separated from the liquid.

23 Claims, No Drawings

US 6,962,628 B1

METHOD OF TREATING EPOXY RESIN-CURED PRODUCT

TECHNICAL FIELD

The present invention relates to a method of treating an epoxy resin-cured product, a method of separating a composite material of inorganic matter and epoxy resin-cured product, and a treatment liquid for an epoxy resin-cured product.

BACKGROUND ART

Epoxy resin-cured products are used in a variety of fields such as insulating materials, adhesives, and paints due to their superiority in electrical characteristics, heat resistance, and adhesion. However, since the epoxy resin becomes infusible and insoluble in general-purpose solvents after it is thermo-cured, it has been difficult to recycle the epoxy resin-cured products and products to which the epoxy resin-cured product adheres or on which the epoxy resin-cured product is applied. Furthermore, it has been difficult as well to separate inorganic fillers, inorganic fibers, inorganic textile fabrics, inorganic fiber nonwoven fabrics, etc., which are blended with the epoxy resin to increase the resin's mechanical properties or the like, from the resin-cured products, for recycling purpose.

A technique of grinding, pulverizing, and separating according to specific gravity is a known example of a method of separating a printed wiring board, which is a composite material of epoxy resin-cured product and inorganic matter such as glass fiber and metal, into each component. However, although recovery and recycling of metals are possible to some extent in this method, pulverized glass fibers and resin powders thus obtained can be utilized only as fillers. Therefore their value as valuable goods is significantly low, and, in addition, it has been impossible to separate each component perfectly. Also, known examples include a method in which resins of printed wiring boards, laminates or the like are thermal-decomposed to recover metals and glass fibers while the thermal-decomposed resins are gasified or liquidized for the recovery, and a method of recovering not only inorganic matter but also the thermal decomposed resins. However, these methods have several problems as follows. Thermal decomposition of resins requires high temperatures so that obtained metals and inorganic matter are oxidized and denaturalized while resins are oxidized or carbonized, thereby decreasing their value; when resins contain toxic materials such as halogens and lead, separation and treatment of these materials require enormous costs.

As mentioned above, for the purpose of recycling of resins, thermal decomposition of resins is not generally preferred. For this reason, there has been a proposition for a method of dissolving thermosetting resin-cured wastes in solvents, especially in organic solvents to separate inorganic matter such as metal and glass (see Japanese Unexamined Patent Application Publication No. 10-314713).

However, because thermosetting resins including the epoxy resin are generally poorly soluble in general-purpose solvents as is clear from their definition "resin rendered insoluble and infusible by application of heat", general solvents as exemplified in the above publication do not have enough solvency for separation and recovery of resin-cured products. Therefore, pulverization is required as a pretreatment before the dissolving treatment, which places a limitation on the recycling application of recovered inorganic matter such as glass fibers in that recovered inorganic matter can be utilized only as pulverized matter and not as woven or nonwoven fabric without reprocessing.

DISCLOSURE OF INVENTION

It is therefore an object of the present invention to provide a treatment method involving decomposition and dissolution of an epoxy resin-cured product in order to easily recover the resin components in a recyclable state without causing thermal decomposition.

Another object of the present invention is to provide a separation method involving decomposition and dissolution of an epoxy resin-cured product to easily separate the inorganic matter and resin components contained in a composite material of inorganic matter and epoxy resin-cured product each in a recyclable state.

A further object of the present invention is to provide a treatment liquid for an epoxy resin-cured product for use in the above-mentioned two methods.

In the steps of processing printed wiring boards, a variety of etching liquids have been used in order to dissolve the epoxy resin-cured product and, as an etching liquid for the epoxy resin-cured product comprising a halogenated high-molecular-weight epoxy polymer, we have reported a series of etching liquids which contain amide-based solvents and alkali metal compounds but do not contain dangerous chemicals such as concentrated sulfuric acid and chromic acid (see Japanese Unexamined Patent Application Publication No. 8-325436, No. 8-325437, No. 8-325438, No. 9-316445, and No. 10-126052). All of these etching liquids have conventionally been directed to etching and removing parts of resin-cured products to form electric circuits, and recovery and recycling of the resin component after removal have been neither meant nor intended at all. However, we have found a fact that the resin components and inorganic matter can easily be recovered in a recyclable state by using these etching liquids improved as a liquid for decomposition and dissolution of the epoxy resin-cured product.

According to one aspect of the present invention there is provided a method of treating an epoxy resin-cured product with a treatment liquid containing a decomposition catalyst for epoxy resin-cured products and an organic solvent to decompose and dissolve the epoxy resin-cured product. The decomposition catalyst for epoxy resin-cured products serves as a catalyst to cleave the ether linkage in the epoxy resin, thereby accelerating the decomposition of the epoxy resin swollen with the organic solvent.

According to another aspect of the present invention there is provided a method of separating a composite material of inorganic matter and epoxy resin-cured product, which comprises the following steps (1) and (2):

(1) treating the composite material of inorganic matter and epoxy resin-cured product with a treatment liquid containing a decomposition catalyst for epoxy resin-cured products and an organic solvent to decompose and dissolve the epoxy resin-cured product;

(2) separating the inorganic matter from the liquid obtained in the step (1).

According to another aspect of the present invention there is provided a treatment liquid for an epoxy resin-cured product containing a decomposition catalyst for epoxy resin-cured products and an organic solvent.

The treatment method and separation method according to the present invention can decompose and dissolve the epoxy resin-cured product to easily recover the resin components in a recyclable state without causing thermal decomposition or without requiring pulverization of materials to be treated by using the above-mentioned treatment liquid. The decomposition products can be recycled, fur example, as a raw material for synthetic resins.

When a composite material containing inorganic matter is a subject to be treated, the inorganic matter insoluble in the treatment liquid (inorganic filler, inorganic fiber, inorganic foil, etc.) can easily be separated from the treatment liquid containing the resin components, which enables recycling of the inorganic matter as well as the resin components.

Furthermore, by applying the present invention to printed wired boards with parts mounted thereon, not only inorganic fillers and inorganic fibers, but also metal foils, which are circuits, and parts connected to the circuits are dispersed in the treatment liquid by decomposition and dissolution of the resin-cured product, thereby enabling separation and recovery of such inorganic matter.

BEST MODE FOR CARRYING OUT THE INVENTION

A method of treating an epoxy resin-cured product according to the present invention involves treating the epoxy resin-cured product with a treatment liquid containing a decomposition catalyst for epoxy resin-cured products and an organic solvent to decompose and dissolve the epoxy resin-cured product.

The epoxy resin-cured product to be treated is essentially comprised of an epoxy resin, a curing agent, and a crosslinking agent, and may further contain a curing accelerator, a catalyst, an elastomer, a flame retardant, etc. Components other than the epoxy resin may be present as impurities.

Any epoxy resin can be an object to be treated as far as it has an epoxy group in the molecule, and examples thereof include bisphenol A-type epoxy resin, bisphenol F-type epoxy resin, bisphenol S-type epoxy resin, alicyclic epoxy resin, aliphatic linear epoxy resin, phenol novolak-type epoxy resin, cresol novolak-type epoxy resin, bisphenol A novolak-type epoxy resin, diglycidyl ethers of biphenols, diglycidyl ethers of naphthalenediols, diglycidyl ethers of phenols, diglycidyl ethers of alcohols, and compounds obtained from the above-mentioned compounds by substitution with an alkyl group, halogenation, or hydrogenation. They can be used singly or in combination.

Among the above-mentioned epoxy resins, use can preferably be made of epoxy resins whose hydrogen located in the ortho position on the benzene ring with respect to the ether group bonded to the same benzene group is substituted with a halogen atom such as chlorine and bromine. Such epoxy resins are obtained by reacting halogenated bisphenol compounds such as tetrabromobisphenol A with epichlorohydrin, and examples include halogenated bisphenol A-type epoxy resin, halogenated bisphenol F-type epoxy resin, and halogenated bisphenol S-type epoxy resin. When an electron-withdrawing halogen atom is bonded to the benzene ring of the epoxy resin, cleavage of the ether linkage is more likely to occur, which can facilitate decomposition and dissolution of the epoxy resin-cured product with a treatment liquid.

Any curing agent for epoxy resins can be included as far as it can cure epoxy resins, and examples thereof include multifunctional phenols, amines, imidazole compounds, acid anhydrides, organic phosphorus compounds, and halides of the above-mentioned compounds. Any of these compounds can be used singly or in combination. Although the amount of the curing agent to be blended is not specifically limited as far as it can promote the curing reaction of the epoxy group, the curing agent is preferably included in a range of 0.01 to 5.0 equivalents, more preferably in a range of 0.8 to 1.2 equivalents, relative to one mole of the epoxy group.

Examples of the multifunctional phenols include monocyclic bifunctional phenols such as hydroquinone, resorcinol, and catechol; polycyclic bifunctional phenols such as bisphenol A, bisphenol F, naphthalenediols, and biphenols; and these compounds halogenated or substituted with an alkyl group. Novolaks and resols, which are polycondensates of these phenols and aldehydes, can be used as well.

Examples of the amines include aliphatic or aromatic primary amines, aliphatic or aromatic secondary amines, aliphatic or aromatic tertiary amines, quaternary ammonium salts thereof, alicyclic amines, guanidines, and urea derivatives. They can be, for example, any one of N,N-benzyldimethylamine, 2-(dimethylaminomethyl)phenol, 2,4,6-tris(dimethylaminomethyl)phenol, tetramethylguanidine, triethanolamine, N,N'-dimethylpiperazine, 1,4-diazabicyclo[2.2.2]octane, 1,8-diazabicyclo[5.4.0]-7-undecene, 1,5-diazabicyclo[4.4.0]-5-nonene, hexamethylenetetramine, pyridine, picoline, piperidine, pyrrolidine, dimethylcyclohexylamine, dimethylhexylamine, cyclohexylamine, diisobutylamine, di-n-butylamine, diphenylamine, N-methylaniline, tri-n-propylamine, tri-n-octylamine, tri-n-butylamine, triphenylamine, tetramethylammonium chloride, tetramethylammonium bromide, tetramethylammonium iodide, triethylenetetramine, diaminodiphenylmethane, diaminodiphenyl ether, dicyandiamide, tolylbiguanide, guanylurea, and dimethylurea.

Examples of the imidazole compounds include imidazole, 2-ethylimidazole, 2-ethyl-4-methylimidazole, 2-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylidazoline, 2-phenyl-4-methylimidazoline, benzimidazole, and 1-cyanoethylimidazole.

Examples of the acid anhydrides include phthalic anhydride, hexahydrophthalic anhydride, pyromellitic dianhydride, and benzophenonetetracarboxylic dianhydride.

Any organic phosphorus compounds can be used as far as it is a phosphorus compound having an organic group. Examples thereof include hexamethylphosphoric triamide, tri(dichloropropyl) phosphate, tri(chloropropyl) phosphate, triphenyl phosphate, trimethyl phosphate, phenylphosphonic acid, triphenylphosphine, tri-n-butylphosphine, and diphenylphosphine.

The epoxy resin-cured product may contain a curing accelerator. Typical examples of curing accelerators include, but are not limited to, tertiary amines, imidazoles, and quaternary ammonium salts.

The epoxy resin-cured product to be subjected to the treatment according to the present invention can be obtained by curing the epoxy resin composition comprising the above-described components using an arbitrary known method and any curing condition can be selected as far as the reaction proceeds. For example, any temperature may be used as far as the reaction proceeds, although curing is in general preferably performed at a temperature ranging between room temperature and about 250° C. Furthermore, the curing reaction may be carried out either under pressure, under atmospheric pressure, or under reduced pressure.

Next, the treatment liquid to decompose and dissolve the above-mentioned resin-cured products contains a decomposition catalyst for epoxy resin-cured products and an organic solvent. In other words, the treatment liquid used in the present invention contains, as essential components, at least a compound that serves as a catalyst for cleavage of the ether linkage of the epoxy resin-cured products and an organic solvent. The treatment liquid may further contain arbitrary known compounds other than the two components or even impurities.

In a preferred embodiment, the decomposition catalyst for epoxy resin-cured products contains one or more compounds selected from alkali metals and/or alkali metal compounds, phosphorous-containing acids and/or salts thereof, and organic acids and/or salts thereof. The term "one or more compounds" means any combination of these compounds is acceptable and examples thereof include a combination of alkali metal compounds, a combination of phosphorous-containing acids (salts), a combination of an alkali metal compound and a phosphorous-containing acid (salt), and a combination of a phosphorous-containing acid (salt) and an organic acid (salt). These compounds are preferably added in an amount of 0.001 to 80% by weight, especially 0.1 to 30% by weight in total in the organic solvent. When the amount is less than 0.001% by weight, the decomposition rate of the epoxy resin-cured product tends to be lower, while when the amount exceeds 80% by weight, the preparation of the treatment liquid tends to be difficult. Moreover, it is not always necessary that all of these compounds are dissolved in the organic solvent, and a saturated solution in which the solute is in an equilibrium state in the solution is also useful because insoluble parts in the saturated solution can supply a source of fresh compounds when the already-dissolved compounds become deactivated during the reaction.

Examples of the alkali metals include lithium, sodium, potassium, rubidium, and cesium. Examples of the alkali metal compounds include hydrides, hydroxides, borohydrides, amide compounds, fluorides, chlorides, bromides, iodides, borates, phosphates, carbonates, sulfates, nitrates, organic acid salts, alcoholates, and phenolates, obtained from any one of these alkali metals. Among these compounds, the alkali metal salts are preferably used due to their high solubility in organic solvents, high catalytic effect (ion activity), and low toxicity as ions. Any of these metals and metal compounds can be used singly or in combination and preferably added in an amount of 0.01 to 80% by weight, especially 0.1 to 10% by weight in an organic solvent.

Examples of the phosphorous-containing acids used herein include phosphoric acid, metaphosphoric acid, hypophosphoric acid, phosphorous acid (phosphonic acid), hypophosphorous acid (phosphinic acid), pyrophosphoric acid, trimetaphosphoric acid, tetrametaphosphoric acid, and pyrophosphorous acid. The salts of phosphorous-containing acids used herein are salts of anions of the above-mentioned phosphorous-containing acids and cations, and the cations can be, for example, ions of lithium, sodium, potassium, rubidium, cesium, beryllium, magnesium, calcium, strontium, barium, titanium, zirconium, vanadium, chromium, manganese, iron, cobalt, nickel, copper, silver, palladium, zinc, aluminum, gallium, stannum, or ammonium. Among these compounds, alkali metal compounds are preferred for the same reason as described above and hydrates are preferred in terms of solubility in solvents. These salts can be any one of primary salts having a metal and two hydrogens, secondary salts having two metals and a hydrogen, and a tertiary salts having three metals. Also, these salts can be any one of acidic salts, alkaline salts, and neutral salts. Any of these compounds can be used singly or in combination and preferably added in an amount of 0.01 to 80% by weight, especially 0.1 to 30% by weight in an organic solvent.

Examples of the organic acids include acrylic acid, adipic acid, ascorbic acid, asparagic acid, aminobenzoic acid, alginic acid, benzoic acid, oleic acid, formic acid, citric acid, glycolic acid, gluconic acid, glutamic acid, cinnamic acid, succinic acid, acetic acid, salicylic acid, oxalic acid, tartaric acid, toluenesulfonic acid, nicotinic acid, lactic acid, uric acid, halogenated acetic acid, phthalic acid, benzenesulfonic acid, malonic acid, butyric acid, and malic acid. The salts of organic acids are salts of anions of the above-mentioned organic acids and cations other than hydrogen, and the cations can be, for example, ions of lithium, sodium, potassium, rubidium, cesium, beryllium, magnesium, calcium, strontium, barium, titanium, zirconium, vanadium, chromium, manganese, iron, cobalt, nickel, copper, silver, palladium, zinc, aluminum, gallium, stannum, or ammonium. Among these compounds, hydrates and alkali metal salts are preferred for the same reason as described above. These salts can be any one of primary salts having a metal and two hydrogens, secondary salts having two metals and a hydrogen, and a tertiary salts having three metals. Also, these salts can be any one of acidic salts, alkaline salts, and neutral salts. Any of these compounds can be used singly or in combination and preferably added in an amount of 0.01 to 80% by weight, especially 0.1 to 30% by weight in an organic solvent.

As an organic solvent, one or more solvents selected from amide-based, alcohol-based, ketone-based, and ether-based solvents are preferably used in terms of solubility of ionic catalysts, but use can also be made of other solvents such as hydrocarbons, halogenated hydrocarbons, phenols, acetals, fatty acids, acid anhydrides, esters, nitrogen compounds, sulfur compounds (such as dimethylsulfoxide) and solvents having two or more functional groups (ester and ether, alcohol and ether, and the like). Any of these solvents can be used singly or in combination (for example, a combination of amide-based solvents and a combination of an amide-based solvent and a non-amide-based solvent). Furthermore, any solvent can be concurrently employed and inorganic solvents such as water and ammonia may be mixed, and impurities may be present.

Preferred examples of the amide-based solvents include formamide, N-methylformamide, N,N-dimethylformamide, N,N-diethylformamide, acetamide, N-methylacetamide, N,N-dimethylacetamide, N,N,N',N'-tetramethylurea, 2-pyrrolidone, N-methyl-2-pyrrolidone, caprolactam, and carbamates.

Examples of the alcohol-based solvents include methanol, ethanol, 1-propanol, 2-propanol, 1-butanol, 2-butanol, iso-butanol, tert-butanol, 1-pentanol, 2-pentaol, 3-pentanol, 2-methyl-1-butanol, iso-pentyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, cyclohexanol, 1-methylcyclohexanol, 2-methylcyclohexanol, 3-methylcyclohexanol, 4-methylcyclohexanol, ethylene glycol, ethylene glycol monomethyl ether, ethylene glycol monoethyl ether, ethylene glycol monopropyl ether, ethylene glycol monobutyl ether, diethylene glycol, diethylene glycol monomethyl ether, diethylene glycol monoethyl ether, diethylene glycol monopropyl ether, diethylene glycol monobutyl ether, triethylene glycol, triethylene glycol monomethyl ether, triethylene glycol monoethyl ether, tetraethylene glycol, polyethylene glycol (molecular weight 200 to 400), 1,2-propanediol, 1,3-propanediol, 1,2-butanediol, 1,3- butanediol, 1,4-butanediol, 2,3-butanediol, 1,5-pentanediol, glycerol, and dipropylene glycol.

Examples of the ketone-based solvents include acetone, methyl ethyl ketone, 2-pentanone, 3-pentanone, 2-hexanone, methyl isobutyl ketone, 2-heptanone, 4-heptanone, diisobutyl ketone, cyclohexanone, methylcyclohexanone, phorone, and isophorone.

Examples of the ether-based solvents include dipropyl ether, diisopropyl ether, dibutyl ether, dihexyl ether, anisole, phenetol, dioxane, tetrahydrofuran, acetal, ethylene glycol dimethyl ether, ethylene glycol diethyl ether, diethylene glycol dimethyl ether, and diethylene glycol diethyl ether.

Although any temperature can be used in preparing the treatment liquid, a temperature ranging between the melting point and the boiling point of the solvent used is preferred. Moreover, the treatment liquid may be prepared either in an air atmosphere or in an inert gas and either under atmospheric pressure (normal pressure), under reduced pressure, or under pressure. Other components such as surfactant may be added to the treatment liquid thus obtained.

The treatment method involving decomposition and dissolution of the epoxy resin-cured product, which is a subject to be treated, with the above-mentioned treatment liquid is not specifically limited, and the treatment may be performed, for example, by immersing the epoxy resin-cured product in the treatment liquid or by spraying the treatment liquid on the epoxy resin-cured product instead of immersing. The treatment liquid may be stirred by an agitator, a pump, or blowing of gas. In the case of dipping treatment, the treatment may be conducted while vibrating the treatment liquid by ultrasound. The treatment liquid for the treatment of the resin-cured product may be used at an arbitrary temperature ranging between the freezing point and the boiling point of the solvent in order to control the treatment rate. For the purpose of avoiding undesired thermal decomposition of the cured resin, however, the treatment liquid may preferably have a temperature of 250° C. or lower in air and 300° C. or lower in an inert gas. The treatment liquid may be used and stored either in air or in an inert gas, and either under atmospheric pressure, under reduced pressure, or under pressure. Although high pressure may be effective in some cases, atmospheric pressure is more preferred when safety is of concern.

The size of the subject to be treated is not specifically limited, and the subject may be just in the state as it is disposed of and recovered (for example, a 250 mm-square printed wiring board) or may be crushed and pulverized. A crushed and pulverized subject requires a shorter time to be treated, but the recovered materials thus obtained have limited applications. In view of this, the size of crushed pieces is preferably approximately 5 mm or larger, or 10 mm or larger. Moreover, when the crushing degree of the subject to be treated reaches pulverization (approximately 1 mm or smaller), recovered glass fibers, for example, find no application for recycling, which may significantly decrease their value. The amount of the treatment liquid with respect to the subject is not specifically limited, and if the treatment liquid contacts the subject, such an amount is enough.

Methods of separating and washing, and application of the resin components (the organic components derived from the resin) decomposed and dissolved in this manner are not specifically limited. For example, the resin components can be obtained by separating and removing residues (insoluble parts) from the liquid by precipitation after the treatment and removing the organic solvent by distillation. The components recovered can be recycled as a raw material for synthetic resins.

Specifically, the decomposition products can be recycled in their recovered state or preferably after purification, when the decomposition products obtained after the treatment of the resin-cured product are, for example, phenols, glycidyl ethers of phenols, metal salts of phenols, amines, carboxylic acids, and halogenated or hydrogenated products of the above-mentioned compounds (in the concrete, such as phenol, cresol, dimethylphenol, propylphenol, ethylphenol, hydroquinone, resorcinol, catechol, bisphenol A, bisphenol F, biphenol, dihydroxydiphenyl ether, dihydroxydiphenyl sulfone, phenol novolak, cresol novolak, bisphenol A novolak, and glycidyl ethers of these compounds, halides of these compounds, alkali metal salts of these compounds, and ammonium salts of these compounds).

Next, a method of separating a composite material of inorganic matter and epoxy resin-cured product according to the present invention includes the following steps (1) and (2);

(1) treating the composite material of inorganic matter and epoxy resin-cured product with a treatment liquid containing a decomposition catalyst for epoxy resin-cured products and an organic solvent to decompose and dissolve the epoxy resin-cured product; and (2) separating the inorganic matter from the liquid obtained in the step (1).

Composite materials of inorganic matter and epoxy resin-cured product to be treated comprise the above-mentioned epoxy resin-cured product and inorganic matter, and are typically insulating boards, metal-clad laminates, or printed wiring boards, which contain metals and glass as inorganic matter.

The inorganic matter can be, for example, metals and metal oxides, hydroxides, halides, or nitrides. More concretely, examples include boron, aluminum, iron, silicon, titanium, chrome, cobalt, nickel, zinc, palladium, silver, stannum, tungsten, platinum, gold, lead, alumina, zirconia, titania, magnesia, silicon carbide, silicon nitride, boron nitride, mica, silica, clay, glass, carbon, calcium carbonate, aluminum hydroxide, magnesium hydroxide, and calcium silicate. These metals and compounds may be fused or mixed. The shape of the inorganic matter may be, for example, powder, granule, fiber, foil, film, wire, or circuit. The fiber may be in a mat-like state or woven like fabric. Although the content of inorganic matter in a composite material is arbitrary, it generally ranges from 5 to 90% by weight based on the total amount of the composite material.

When the inorganic matter is, for example, powdery, granular, or staple-like, such inorganic matter is blended with the above-mentioned epoxy resin composition for curing, which is cured by cast molding or the like to obtain a composite material of inorganic matter and epoxy resin-cured product. When the inorganic matter is mat-like or fabric-like, such inorganic matter is immersed in the above-mentioned epoxy resin composition (which may contain powdery, granular, or staple-like inorganic matter as described above) and then partial-cured to obtain a B-stage prepreg. Such a B-stage prepreg and laminates obtained by laminating and curing this prepreg or a prepreg at a pre-B-stage are also the composite material of inorganic matter and epoxy resin-cured product. The present invention is further applicable to the composite materials of inorganic matter and epoxy resin-cured product such as: resin boards or films covered with a metal foil obtained by coating or flow-coating the metal foil with the above-mentioned epoxy resin composition (which may contain powdery, granular, or staple-like inorganic matter as described above) and then curing the same; resin boards covered with a metal foil obtained by laminating a metal foil onto the above-mentioned prepreg or prepreg at a pre-B-stage and then curing the same; laminates covered with a metal foil obtained by laminating the above-mentioned metal foil-covered resin boards or films (before curing) or metal foil-covered resin boards (which are formed with prepregs and before curing) onto the above-mentioned laminates and then curing the same; interlayer circuit boards obtained by using the above-mentioned epoxy resin composition (which may contain powdery, granular, or staple-like inorganic matter as described above) and metal foils and applying an appropriate circuit formation method; and laminates covered with a metal foil obtained by laminating the above-mentioned metal foil covered-resin boards or films (before curing) or the metal foil covered-resin boards (which are formed with prepregs and before curing) onto the above-mentioned interlayer circuit boards and then curing the same. The above-mentioned resin boards, films, or laminates, which have metal foils, may be ones having a circuit formed by applying a circuit formation method to metal foils.

The step (1) of treating the composite materials, the resin components thus obtained and recycling thereof are the same as described for the treatment method of the epoxy resin-cured product. The separation step (2) is not specifically limited and inorganic matter such as metals and glass can easily be separated from the liquid, for example, by filtration or decantation, for recycling purpose. According to the separation method of the present invention, because subjects to be treated such as substrate need not to be crushed or pulverized before the treatment, inorganic matter can be recovered in such a recyclable state that is suitable for a variety of applications. For example, it is possible to recycle glass fibers (glass fabrics) in their recovered state.

Furthermore, a treatment liquid for an epoxy resin-cured product according to the present invention contains a decomposition catalyst for epoxy resin-cured products and an organic solvent and is preferably used in the method of treating the epoxy resin-cured product according to the present invention and in the method of separating composite materials of inorganic matter and epoxy resin-cured product according to the present invention. The preferred components and preparation method of the treatment liquid are the same as described for the above-mentioned method of treating the epoxy resin-cured product.

EXAMPLES

The present invention is illustrated in detail with reference to the examples, which are not intended to limit the present invention. In the following examples, % means % by weight.

A. Solubility in Treatment Liquid Containing Alkali Metal Compound (1)

Examples A1 to A15 and Comparative Examples A1 to A6

(Preparation of Epoxy Resin Composition)

Epoxy resin compositions were prepared by blending a brominated bisphenol A-type epoxy resin (manufactured by Sumitomo Chemical, Co., Ltd., product name "ESB400T"; epoxy equivalent 400, bromine content 48%), a bisphenol A-type epoxy resin (manufactured by Yuka Shell Epoxy Kabushiki Kaisha, product name "Epikote 1001"; epoxy equivalent 470), a phenol novolak resin (manufactured by Hitachi Chemical Co., Ltd., product name "HP850N"; hydroxyl equivalent 106) as a curing agent, and imidazole as a curing accelerator. The amounts of the two epoxy resins and the phenol novolak resin were adjusted such that the ratio of the epoxy equivalent to the hydroxyl equivalent was 1. The amount of each epoxy resin was adjusted such that two samples of the epoxy resin composition with a respective bromine content of 20% and 30% relative to the total amount of the epoxy resin composition were obtained. The curing agent was added in an amount of 0.5% based on the total amount of the epoxy resins.

Two samples of the epoxy resin composition obtained in this manner were cured in an oven at 170° C. for 60 minutes to obtain two kinds of resin boards with different bromine contents (about 0.5 to about 1.0 mm thick).

(Preparation of Treatment Liquid)

In each case of Examples A1 to A15, components listed in Table 1 were mixed to prepare a 3% solution of an alkali metal compound in an amide-based, ketone-based, alcohol-based or ether-based organic solvent. In some of these treatment liquids, the alkali metal compound was not completely dissolved and precipitated on the bottom of a tank when the liquids were allowed to stand.

The abbreviations for the organic solvents in Table 1 are as follows: NMP, N-methyl-2-pyrrolidone; CHON, cyclohexanone; PEG, polyethylene glycol #200; DGMM, diethylene glycol monomethyl ether; and DGDM, diethylene glycol dimethyl ether.

Treatment liquid that contained no alkali metal compound was used in each case of Comparative Examples A1 to A5, and a 3% aqueous solution of sodium hydroxide was prepared in Comparative Example A6.

(Treatment of Epoxy Resin-Cured Product)

The two resin boards were cut into pieces of a size of about 5 mm square each and 0.5 g of the pieces were weighed out and placed in 50 g of each treatment liquid. The treatment liquids were maintained at a predetermined temperature (60° C., 80° C., or 100° C.) and agitated hard for one hour. The treatment liquids were visually inspected to evaluate the solubility according to the following rating. 5: all dissolved; 4: almost all dissolved; 3: half dissolved; 2: significantly broken; 1: broken to some extent; 0: no change.

The results are shown in Table 1.

TABLE 1

A. Solubility in treatment liquid containing alkali metal compound (1)

| Example | Composition of treatment liquid | Bromine content: 20% by weight | | | Bromine content: 30% by weight | | |
|---|---|---|---|---|---|---|---|
| | | 60° C. | 80° C. | 100° C. | 60° C. | 80° C. | 100° C. |

TABLE 1-continued

A. Solubility in treatment liquid containing alkali metal compound (1)

| | Composition of treatment liquid | | Bromine content: 20% by weight | | | Bromine content: 30% by weight | | |
|---|---|---|---|---|---|---|---|---|
| | | | 60° C. | 80° C. | 100° C. | 60° C. | 80° C. | 100° C. |
| A 1 | KOH | NMP | 4 | 5 | 5 | 5 | 5 | 5 |
| A 2 | | CHON | 2 | 3 | 4 | 4 | 4 | 5 |
| A 3 | | PEG | 0 | 1 | 2 | 3 | 3 | 5 |
| A 4 | | DGMM | 1 | 1 | 2 | 3 | 4 | 5 |
| A 5 | | DGDM | 0 | 1 | 3 | 3 | 4 | 5 |
| A 6 | NaCl | NMP | 3 | 4 | 5 | 4 | 5 | 5 |
| A 7 | | CHON | 1 | 2 | 3 | 2 | 4 | 5 |
| A 8 | | PEG | 0 | 0 | 1 | 1 | 2 | 2 |
| A 9 | | DGMM | 0 | 1 | 2 | 2 | 2 | 3 |
| A 10 | | DGDM | 0 | 1 | 3 | 2 | 3 | 3 |
| A 11 | $Na_2CO_3$ | NMP | 1 | 3 | 5 | 3 | 5 | 5 |
| A 12 | | CHON | 0 | 2 | 2 | 2 | 3 | 4 |
| A 13 | | PEG | 0 | 0 | 1 | 1 | 2 | 2 |
| A 14 | | DGMM | 0 | 1 | 2 | 2 | 3 | 3 |
| A 15 | | DGDM | 0 | 1 | 2 | 2 | 3 | 3 |
| Comp. Ex. | | | | | | | | |
| A 1 | — | NMP | 0 | 0 | 0 | 0 | 0 | 0 |
| A 2 | | CHON | 0 | 0 | 0 | 0 | 0 | 0 |
| A 3 | | PEG | 0 | 0 | 0 | 0 | 0 | 0 |
| A 4 | | DGMM | 0 | 0 | 0 | 0 | 0 | 0 |
| A 5 | | DGDM | 0 | 0 | 0 | 0 | 0 | 0 |
| A 6 | KOH | Water | 0 | 0 | 0 | 0 | 0 | 0 |

As shown in Table 1, when the resin boards were treated with an organic solvent alone as in Comparative Examples A1 to A5, the resin-cured products were not dissolved. In Comparative Example A6, where the resin boards were treated with an aqueous solution of an alkali metal compound, the result was the same.

In contrast, in Examples A1 to A15, when the resin boards were treated with an organic solvent solution of an alkali metal compound, solubility was good in all the cases and the resin was dissolved completely in some cases.

B. Solubility in Treatment Liquid Containing Alkali Metal Compound (2)

Examples B1 to B15, Comparative Examples B1 to B6

(Preparation of Composite Material of Inorganic Matter and Epoxy Resin-cured Product)

(1) The following two kinds of copper-clad laminate were provided: "MCL-E-679" (bromine content in the resin-cured product is 15%) and "MCL-E-67" (bromine content in the resin-cured product is 20%); both which are manufactured from a brominated epoxy resin, a bromine-free epoxy resin, a curing agent, a curing accelerator, glass cloth, and copper foil, and both are product names of Hitachi Chemical Co., Ltd.

(2) An epoxy resin composition was prepared by blending a brominated bisphenol A-type epoxy resin (manufactured by Tohto Kasei Co., Ltd., product name "AER8011"; epoxy equivalent 470, bromine content 20%), a high-molecular-weight brominated bisphenol A-type epoxy resin (bromine content 53%, number average molecular weight 25,000; the number average molecular weight was measured by gel permeation chromatography and converted based on a calibration curve prepared with a standard polystyrene), a phenol novolak resin (manufactured by Hitachi Chemical Co., Ltd., product name "HP850N"; hydroxyl equivalent 106) as a curing agent, and 2-methyl-4-methylimidazole as a curing accelerator. The amounts of the two epoxy resins and the phenol novolak resin were adjusted such that the ratio of the epoxy equivalent to the hydroxyl equivalent was 1. The amount of each epoxy resin was adjusted to give a bromine content of 28% relative to the total amount of the epoxy resin composition excluding the amount of inorganic matter. The curing agent was added in an amount of 0.5% based on the total amount of the epoxy resins.

Glass cloth was impregnated with the epoxy resin composition obtained and predried at 160° C. for 4 minutes to form a prepreg. A copper foil was laminated onto the prepreg, which was then dried at 170° C. for 90 minutes to obtain a copper-clad laminate, which is a composite material of inorganic matter and epoxy resin-cured product. This is referred to as "self-made laminate sample" hereinafter.

(3) Two kinds of the copper-clad laminate of (1) and the self-made laminate sample of (2) were cut into pieces of a size of 10 mm by 50 mm each and three lines of circuit of 1 mm-wide copper foils were formed on the both sides of each piece to obtain test pieces.

(Preparation of Treatment Liquid)

In each case of Examples B1 to B15, components listed in Table 2 were mixed to prepare a 3% solution of an alkali metal compound in an amide-based, ketone-based, alcohol-based or ether-based organic solvent(s). The combinations shown in Examples B1, B2, and B5 were NMP 80% and PEG 17%, CHON 80% and DGMM 17%, and DGDM 80% and PEG 17%, respectively. In some of these treatment liquids, the alkali metal compound was not completely dissolved and precipitated on the bottom of a tank when the liquids were allowed to stand. The compound names in Table 2 are the same as in Table 1.

Treatment liquid that contained no alkali metal compound was used in each case of Comparative Examples B1 to B5, and a 3% aqueous solution of sodium hydroxide was prepared in Comparative Example B6.

(Treatment of Composite Material)

The above-mentioned three kinds of test pieces were weighed and then immersed in each of the treatment liquids at a predetermined temperature (60° C. or 100° C.). After 60 minutes, the test pieces were taken out from the treatment liquid and weighed again. The weight of the resin-cured product before the treatment was calculated from the ratio of the resin in the composite material, and the rate of change in weight of the resin-cured product was calculated from the difference in weight before and after the treatment to obtain a solubility of the resin-cured product in the treatment liquid.

The results are shown in Table 2.

TABLE 2

B. Solubility in treatment liquid containing alkali metal compound (2)
(Solubility/%)

| | | Composition of treatment liquid | Temperature: 60° C. | | | Temperature: 100° C. | | |
|---|---|---|---|---|---|---|---|---|
| | | | E-679 Br 15 wt % | E-67 Br 20 wt % | Sample* Br 28 wt % | E-679 Br 15 wt % | E-67 Br 20 wt % | Sample* Br 28 wt % |
| Example | | | | | | | | |
| B 1 | KOH | NMP, PEG | 1.3 | 4.9 | 48.0 | 2.5 | 29.7 | 93.5 |
| B 2 | | CHON, DGMM | 2.1 | 2.2 | 12.3 | 2.9 | 5.4 | 57.8 |
| B 3 | | PEG | 2.2 | 2.3 | 3.3 | 2.3 | 6.1 | 33.7 |
| B 4 | | DGMM | 1.7 | 2.1 | 9.6 | 2.6 | 16.3 | 89.0 |
| B 5 | | DGDM, PEG | 1.8 | 2.1 | 12.7 | 2.9 | 5.4 | 57.8 |
| B 6 | NaCl | NMP | 0.9 | 3.5 | 25.1 | 3.2 | 4.5 | 68.0 |
| B 7 | | CHON | 1.9 | 1.7 | 11.6 | 2.0 | 2.4 | 23.8 |
| B 8 | | PEG | 2.1 | 1.8 | 3.4 | 2.7 | 2.1 | 4.2 |
| B 9 | | DGMM | 1.7 | 1.2 | 7.2 | 2.3 | 1.8 | 8.3 |
| B 10 | | DGDM | 1.5 | 1.8 | 9.4 | 1.6 | 2.8 | 9.8 |
| B 11 | $Na_2CO_3$ | NMP | 0.9 | 1.8 | 25.4 | 1.9 | 23.4 | 53.3 |
| B 12 | | CHON | 1.8 | 1.7 | 9.7 | 1.9 | 3.7 | 22.6 |
| B 13 | | PEG | 2.1 | 1.5 | 3.3 | 1.7 | 1.9 | 3.1 |
| B 14 | | DGMM | 2.0 | 2.7 | 9.6 | 2.3 | 3.2 | 10.0 |
| B 15 | | DGDM | 2.2 | 1.6 | 13.4 | 2.0 | 3.0 | 13.8 |
| Comp. Ex. | | | | | | | | |
| B 1 | — | NMP | 0.4 | 0.2 | 0.6 | 0.8 | 0.5 | 0.9 |
| B 2 | | CHON | 0.3 | 0.3 | 0.4 | — | — | — |
| B 3 | | PEG | 0.2 | 0.2 | 0.3 | — | — | — |
| B 4 | | DGMM | 0.4 | 0.3 | 0.5 | — | — | — |
| B 5 | | DGDM | 0.5 | 0.4 | 0.4 | — | — | — |
| B 6 | KOH | Water | 0.3 | 0.1 | 0.2 | 0.2 | 0.4 | 0.8 |

*self-made laminate sample

As shown in Table 2, when treated with an organic solvent alone as in Comparative Examples B1 to B5, no test piece showed a solubility exceeding 1%. Also, even when treated with an aqueous solution of an alkali metal compound as in Comparative Example B6, the solubility was below 1%.

In contrast, when the treatment liquid was an organic solvent solution of an alkali metal compound as in Examples B1 to B15, a maximum solubility of 93.5% was obtained. Although the composite material with lower bromine content showed a lower solubility, the solubility was two to ten times as high as that in Comparative Examples.

C. Solubility in Treatment Liquid Containing a Phosphorous-Containing Acid/its Salt Examples C1 to C45, Comparative Examples C1 to C21

(Preparation of Composite Material of Inorganic Matter and Epoxy Resin-Cured Product)

A brominated epoxy resin-cured product, glass cloth, and copper foil were used to form a composite material, which was heated to 170° C. for 90 minutes to cure. Dicyandiamide, which is an amine, was added as a curing agent of the brominated epoxy resin. The amount of the brominated epoxy resin was adjusted to yield a bromine content of the resin-cured product of approximately 20%.

The sample was cut into a size of 10 mm by 30 mm and three lines of circuit of 1 mm-wide copper foils were formed on the both sides of the cut sample to obtain a test piece.

(Preparation of Treatment Liquid)

In each case of Examples C1 to C45, a phosphorous-containing acid or its salt listed in Table 3 was weighed in an amount corresponding to 1.0 equivalent with respect to one liter of solvent and mixed with the solvent at room temperature to prepare a treatment liquid. The compound names of the organic solvents shown in Table 3 are the same as in Examples A.

Comparative Examples are: Comparative Examples C1 to C3 where each treatment liquid contained an organic solvent only; Comparative Examples C4 where the treatment liquid contained water only; and Comparative Examples C5 to C21 where each treatment liquid was a 3% aqueous solution of a phosphorous-containing acid or its salt listed in Table 3.

(Preparation of Composite Material)

Each of above-mentioned treatment liquids was placed in a flask equipped with a condenser, a thermometer, an inlet for nitrogen, and a stirrer and heated to 140° C. (for organic solvents) or 100° C. (for aqueous solutions) in an oil bath while being mildly stirred under nitrogen gas stream. The above-mentioned test piece was weighed, immersed in each treatment liquid for four hours, taken out and weighed again. The change in weight before and after the treatment was divided by the total weight of the resin in the test piece which was weighted beforehand to obtain a solubility of the resin-cured product.

The results are shown in Table 3.

TABLE 3

C. Solubility in treatment liquid containing phosphorous-containing acid/its salt (Solubility/%)

| Ex. | Composition | | /% |
|---|---|---|---|
| C 1 | $HPO_3$ | NMP | 3.6 |
| C 2 | | DGMM | 1.2 |
| C 3 | | CHON | 0.4 |
| C 4 | $H_3PO_4$ | NMP | 13.9 |
| C 5 | | DGMM | 0.3 |
| C 6 | | CHON | 0.1 |
| C 7 | $H_3PO_3$ | NMP | 11.4 |
| C 8 | | DGMM | 0.2 |
| C 9 | | CHON | 0.1 |
| C 10 | $Na_3PO_4 \cdot$ | NMP | 37.6 |
| C 11 | $12H_2O$ | DGMM | 28.1 |
| C 12 | | CHON | 4.5 |
| C 13 | $(NaPO_3)_n$ | NMP | 2.1 |
| C 14 | | DGMM | 1.1 |
| C 15 | | CHON | 0.5 |
| C 16 | $Na_2HPO_4$ | NMP | 2.5 |
| C 17 | | DGMM | 2.3 |
| C 18 | | CHON | 0.3 |
| C 19 | $Na_2HPO_4 \cdot$ | NMP | 6.1 |
| C 20 | $12H_2O$ | CHON | 1.0 |
| C 21 | $NaH_2PO_4 \cdot$ | NMP | 13.0 |
| C 22 | $2H_2O$ | DGMM | 1.2 |
| C 23 | | CHON | 0.4 |
| C 24 | $Na_2HPO_3 \cdot$ | NMP | 6.5 |
| C 25 | $5H_2O$ | DGMM | 2.2 |
| C 26 | | CHON | 0.8 |
| C 27 | $NaPH_2O_2 \cdot$ | NMP | 11.0 |
| C 28 | $H_2O$ | DGMM | 1.6 |
| C 29 | | CHON | 0.9 |
| C 30 | $K_3PO_4 \cdot$ | NMP | 20.5 |
| C 31 | $nH_2O$ | DGMM | 33.7 |
| C 32 | | CHON | 6.4 |
| C 33 | $(KPO_3)_n$ | NMP | 3.8 |
| C 34 | | DGMM | 1.1 |
| C 35 | | CHON | 0.2 |
| C 36 | $Mg_3PO_4 \cdot$ | NMP | 7.4 |
| C 37 | $8H_2O$ | DGMM | 1.5 |
| C 38 | $AlPO_4$ | NMP | 2.2 |
| C 39 | | DGMM | 1.8 |
| C 40 | $Ca_3(PO_4)_2$ | NMP | 1.8 |
| C 41 | | DGMM | 1.1 |
| C 42 | $FePO_4 \cdot$ | NMP | 3.7 |
| C 43 | $nH_2O$ | DGMM | 1.2 |
| C 44 | $(NH_4)_3PO_4 \cdot$ | NMP | 5.8 |
| C 45 | $3H_2O$ | DGMM | 1.6 |

| Comp. Ex. | Conposition | | /% |
|---|---|---|---|

TABLE 3-continued

C. Solubility in treatment liquid containing phosphorous-containing acid/its salt (Solubility/%)

| C 1 | NMP | 0.8 |
|---|---|---|
| C 2 | DGMM | 1.2 |
| C 3 | CHON | 0.9 |
| C 4 | W (=Water) | 0.0 |
| C 5 | $HPO_3$ + W | 0.0 |
| C 6 | $H_3PO_4$ + W | 0.0 |
| C 7 | $H_3PO_3$ + W | 0.0 |
| C 8 | $Na_3PO_4 \cdot 12H_2O$ + W | 0.0 |
| C 9 | $(NaPO_3)_n$ + W | 0.0 |
| C 10 | $Na_2HPO_4$ + W | 0.0 |
| C 11 | $Na_2HPO_4 \cdot 12H_2O$ + W | 0.0 |
| C 12 | $NaH_2PO_4 \cdot 2H_2O$ + W | 0.0 |
| C 13 | $Na_2HPO_3 \cdot 5H_2O$ + W | 0.0 |
| C 14 | $NaPH_2O_2 \cdot H_2O$ + W | 0.0 |
| C 15 | $K_3PO_4 \cdot nH_2O$ + W | 0.0 |
| C 16 | $(KPO_3)_n$ + W | 0.0 |
| C 17 | $Mg_3PO_4 \cdot 8H_2O$ + W | 0.0 |
| C 18 | $AlPO_4$ + W | 0.0 |
| C 19 | $Ca_3(PO_4)_2$ + W | 0.0 |
| C 20 | $FePO_4 \cdot nH_2O$ + W | 0.0 |
| C 21 | $(NH_4)_3PO_4 \cdot 3H_2O$ + W | 0.0 |

As shown in Table 3, the solubility was approximately 1% in Comparative Examples C1 to C3 where the treatment liquid was only an organic solvent. And the solubility was 0% in Comparative Examples C4 to C21 where the treatment liquid was only water or an aqueous solution of a phosphorous-containing acid or its salt.

In contrast, the treatment liquid dissolved the resin-cured product in all the cases of Examples C1 to C45 where the treatment liquid was an organic solvent solution of a phosphorous-containing acid or its salt although the solubility varied depending on the solvent. In particular, high solubility was shown in Examples C10, C11, C30, and C31.

D. Solubility in Treatment Liquid Containing Organic Acid or Its Salt

Examples D1 to D34, Comparative Examples D1 to D20

A composite material of inorganic matter and epoxy resin-cured product was prepared as in Examples C and subjected to the same treatment as in Examples C with a respective one of the treatment liquids containing the components listed in Table 4 to determine the solubility in each treatment liquid.

The results are shown in Table 4.

TABLE 4

D. Solubility in treatment liquid containing organic acid/its salt (Solubility /%)

| Ex. | Composition | | /% | Comp. Ex. | Composition | /% |
|---|---|---|---|---|---|---|
| D1 | Lithium acetate | NMP | 8.2 | D1 | NMP | 0.8 |
| D2 | | DGMM | 2.1 | D2 | DGMM | 1.2 |
| D3 | Lithium acetate | NMP | 21.3 | D3 | W (= Water) | 0.0 |
| D4 | dihydrate | DGMM | 3.2 | D4 | Lithium acetate + W | 0.0 |
| D5 | Lithium citrate | NMP | 7.6 | D5 | Lithium acetate dihydrate + W | 0.0 |
| D6 | tetrahydrate | DGMM | 12.3 | D6 | Lithium citrate tetrahydrate + W | 0.0 |
| D7 | Sodium acetate | NMP | 7.4 | D7 | Sodium acetate + W | 0.0 |
| D8 | | DGMM | 4.2 | D8 | Sodium benzoate + W | 0.0 |
| D9 | Sodium benzoate | NMP | 12.5 | D9 | Sodium citrate dehydrate + W | 0.0 |
| D10 | | DGMM | 1.3 | D10 | Sodium succinate hexahydrate + W | 0.0 |
| D11 | Sodium citrate | NMP | 7.0 | D11 | Sodium tartrate dihydrate + W | 0.0 |
| D12 | dehydrate | DGMM | 2.1 | D12 | Sodium benzenesulfonate hydrate + W | 0.0 |
| D13 | Sodium succinate | NMP | 9.3 | D13 | Potassium acetate + W | 0.0 |
| D14 | hexahydrate | DGMM | 2.0 | D14 | Potassium benzoate + W | 0.0 |
| D15 | Sodium tartrate | NMP | 6.5 | D15 | Potassium citrate + W | 0.0 |
| D16 | dihydrate | DGMM | 2.4 | D16 | Aluminium acetate hydrate + W | 0.0 |
| D17 | Sodium benzenesulfonate | NMP | 1.9 | D17 | Calcium acetate hydrate + W | 0.0 |
| D18 | hydrate | DGMM | 1.3 | D18 | Iron citrate hydrate + W | 0.0 |
| D19 | Potassium acetate | NMP | 22.0 | D19 | Ammonium acetate + W | 0.0 |
| D20 | | DGMM | 13.3 | D20 | Tartaric acid + W | 0.0 |
| D21 | Potassium benzoate | NMP | 10.2 | | | |
| D22 | | DGMM | 1.6 | | | |
| D23 | Potassium citrate | NMP | 5.6 | | | |
| D24 | | DGMM | 2.1 | | | |
| D25 | Aluminium acetate | NMP | 3.5 | | | |
| D26 | hydrate | DGMM | 1.7 | | | |
| D27 | Calcium acetate | NMP | 7.3 | | | |
| D28 | hydrate | DGMM | 1.6 | | | |
| D29 | Iron citrate | NMP | 3.3 | | | |
| D30 | hydrate | DGMM | 2.1 | | | |
| D31 | Ammonium acetate | NMP | 6.4 | | | |
| D32 | | DGMM | 1.4 | | | |
| D33 | Tartaric acid | NMP | 1.3 | | | |
| D34 | | DGMM | 1.9 | | | |

As shown in Table 4, the solubility was approximately 1% in Comparative Examples D1 and D2 where the treatment liquid was an organic solvent. The solubility was 0% in Comparative Examples D3 to D20 where the treatment liquid was only water or an aqueous solution of an organic acid or its salt.

In contrast, the treatment liquid dissolved the resin-cured product in all the cases of Examples D1 to D34 where the treatment liquid was an organic solvent solution of an organic acid or its salt, although the solubility varied depending on the solvent. In particular, high solubility was shown in Examples D3, D6, D9, D19, D20, and D21.

The present disclosure relates to subject matter contained in Japanese Patent Applications NO. HEI11-286187, filed on Oct. 7, 1999, and No. HEI11-286188, filed on Oct. 7, 1999, the disclosure of which is incorporated herein by reference.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of treating an epoxy resin-cured product with a treatment liquid, wherein the liquid contains a decomposition catalyst for epoxy resin-cured products and an organic solvent to decompose and dissolve the epoxy resin-cured product, the epoxy resin-cured product contains a halogen atom, and the product is contacted with the liquid to give decomposition products containing a compound recyclable as a raw material of synthetic resins.

2. The method according to claim 1, wherein the decomposition catalyst for epoxy resin-cured products contains at least one of alkali metals and alkali metal compounds, phosphorous-containing acids and salts thereof, and organic acids and salts thereof.

3. The method according to claim 1, wherein the organic solvent contains at least one of amide-based solvents, alcohol-based solvents, ketone-based solvents, and ether-based solvents.

4. The method according to claim 2, wherein the alkali metal compounds are alkali metal salts.

5. The method according to claim 2, wherein the salts of phosphorous-containing acids are hydrates and/or alkali metal salts.

6. The method according to claim 2, wherein the salts of organic acids are hydrates and/or alkali metal salts.

7. The method according to claim 1, wherein the epoxy resin-cured product is treated under atmospheric pressure.

8. The method according to claim 1, wherein the treatment liquid has a temperature of 250° C. or lower in air and 300° C. or lower in an inert gas.

9. A method of separating a composite material of inorganic matter and epoxy resin-cured product, comprising:

(1) treating the composite material of inorganic matter and epoxy resin-cured product with a treatment liquid containing a decomposition catalyst for epoxy resin-cured products and an organic solvent to decompose and dissolve the epoxy resin-cured product, wherein the composite material is contacted with the liquid; and (2) separating the inorganic matter from the liquid contacted with the composite material obtained in the step (1).

10. The method according to claim 9, wherein the decomposition catalyst for epoxy resin-cured products contains at least one of alkali metals and alkali metal compounds, phosphorous-containing acids and salts thereof, and organic acids and salts thereof.

11. The method according to claim 9, wherein the organic solvent contains at least one of amide-based solvents, alcohol-based solvents, ketone-based solvents, and ether-based solvents.

12. The method according to claim 10, wherein the alkali metal compounds are alkali metal salts.

13. The method according to claim 10, wherein the salts of phosphorous-containing acids are hydrates and/or alkali metal salts.

14. The method according to claim 10, wherein the salts of organic acids are hydrates and/or alkali metal salts.

15. The method according to claim 9, wherein the epoxy resin-cured product contains a halogen atom.

16. The method according to claim 9, wherein the inorganic matter is metal and/or glass.

17. The method according to claim 9, wherein the composite material of inorganic matter and epoxy resin-cured product is at least one of an insulating board, a metal-clad laminate, and a printed wiring board.

18. The method according claim 9, wherein a decomposition product of the epoxy resin-cured product contains a compound recyclable as a raw material of synthetic resins.

19. The method according to claim 9, wherein the epoxy resin-cured product is treated under atmospheric pressure in the step (1).

20. The method according to claim 9, wherein the treatment liquid in the step (1) has a temperature of 250° C. or lower in air and 300° C. or lower in an inert gas.

21. A treatment liquid for an epoxy resin-cured product containing a decomposition catalyst for epoxy resin-cured products and an organic solvent, wherein the epoxy resin-cured product contains a halogen atom.

22. The treatment liquid according to claim 21, wherein the decomposition catalyst for epoxy resin-cured products contains at least one of alkali metals and alkali metal compounds, phosphorous-containing acids and salts thereof, and organic acids and salts thereof.

23. The treatment liquid according to claim 21, wherein the organic solvent contains at least one of amide-based solvents, alcohol-based solvents, ketone-based solvents, and ether-based solvents.

* * * * *